United States Patent
Vilangudipitchai et al.

(10) Patent No.: US 7,622,955 B2
(45) Date of Patent: Nov. 24, 2009

(54) POWER SAVINGS WITH A LEVEL-SHIFTING BOUNDARY ISOLATION FLIP-FLOP (LSIFF) AND A CLOCK CONTROLLED DATA RETENTION SCHEME

(75) Inventors: Ramaprasath Vilangudipitchai, Dallas, TX (US); Sumanth Katte Gururajarao, Dallas, TX (US); Hugh T. Mair, Fairview, TX (US); Alice Wang, Allen, TX (US); Uming U. Ko, Plano, TX (US); Sushma Honnavara-Prasad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 12/104,580

(22) Filed: Apr. 17, 2008

(65) Prior Publication Data
US 2009/0262588 A1 Oct. 22, 2009

(51) Int. Cl.
*H03K 19/094* (2006.01)

(52) U.S. Cl. .............................. 326/68; 326/21; 326/46
(58) Field of Classification Search ................... 326/21, 326/37, 38, 46, 62–68
See application file for complete search history.

(56) References Cited

U.S. PATENT DOCUMENTS

2005/0162188 A1* 7/2005 Newman ...................... 326/62
2008/0007312 A1* 1/2008 Clark et al. .................. 327/218

* cited by examiner

*Primary Examiner*—Don P Le
(74) *Attorney, Agent, or Firm*—Ronald O. Neerings; Wade James Brady, III; Frederick J. Telecky, Jr.

(57) ABSTRACT

An apparatus for providing active mode power reduction for circuits having data retention includes a master slave flip flop (MSFF) for latching a data input. An output level shifter (OLS), coupled to the MSFF, retains the data input in response to the MSFF being operable in an active power saving mode (APSM) to reduce power. The OLS operating in the APSM provides a level shifter output having a configurable voltage, thereby providing output isolation. A change in an operating mode of the MSFF between an active mode and the APSM is independent of a retention (RET) mode input.

21 Claims, 8 Drawing Sheets

| PARAMETER | APPARATUS 100 (LSIFF) | APPARATUS 300 AND 302 (CCRS) |
|---|---|---|
| PERFORMANCE IMPACT OF POWER DOMAIN | 5% | 2.1% |
| POWER (ACTIVE LEAKAGE REDUCTION) OF POWER DOMAIN | 600% - 1000% | 5 - 9X |
| AREA PENALTY | 7% | 0% |

POWER SAVINGS WITH A LEVEL-SHIFTING BOUNDARY ISOLATION FLIP-FLOP (LSIFF) AND A CLOCK CONTROLLED DATA RETENTION SCHEME

BACKGROUND

The present invention is related in general to integrated circuits (ICs), and more particularly to an apparatus for power management circuits having data retention.

Many portable electronic devices such as cellular phones, digital cameras/camcorders, personal entertainment devices, laptop or palmtop computers, and video games operate on batteries. During periods of inactivity or reduced activity the device may not perform processing operations and the device or selectable portions thereof may be placed in one of a plurality of power saving (or power reduction) modes of operation. Typical power saving modes may include a power-down mode, a standby power mode, and an active power saving (or idle state low power mode). The device operating in an active mode of operation (e.g., mode in which the device is fully functional consuming rated power) may detect a slightly higher idle time compared to a reference. A power management circuit (PMC) may detect the higher idle time and may place the device in the active power saving mode until the idle time is equal to or below the reference. A typical duration for which the device (or a portion thereof) may be placed in the power-down mode, the standby power mode, and the active power saving mode may respectively vary from several hours or days for the power-down mode, to several minutes or hours for the or standby power mode, and to a few or several clock cycles for the active power saving mode.

It is well known that various circuits within the electronic device may be partitioned into multiple logic circuit domains that may be powered by corresponding power domains. The power domains may be selectively controlled in the various power saving modes of operation to reduce power consumption. Traditional data retention circuits such as flip flops or latches within the device may be used to store status information for later use prior to the circuit or the device entering the power saving mode. The data retention latch, which may also be referred to as a shadow latch or a balloon latch, is typically powered by a separate 'always on' power supply. However, restoration of the retained status information for devices operating in an active power saving mode in a timely manner, e.g., without any clock latency, represents a challenge for designing portable devices having an extended battery life. In addition, presence of leakage current during the active power saving mode also reduce the battery life.

SUMMARY

Applicants recognize existing tools and techniques for providing traditional data retention in an active power saving mode typically depend on a retention (RET) signal for controlling placement of circuits and power domains in and out of data retention to conserve power. The RET signal is typically provided to multiple logic circuits powered by the multiple power domains. The complexity of logic required to process and distribute the RET signal often causes delays, thereby making it difficult for the status information to be restored without any clock latency and in a timely manner. For example, for obtaining a timely response, it is often required to generate multiple chains of the RET signal, combine them using additional logic, and drive it back to a power switch controller (PSCON). Therefore, it would be desirable to provide an improved data retention technique for use in an active power saving mode, preferably a technique that is simple and free from the use of the RET signal.

Applicants also recognize existing tools and techniques for providing data retention in an active power saving mode typically deploy traditional data retention flip flops within (internal to) and also at the boundary of the power domains. In addition, output isolation circuits are also typically provided at circuit boundaries to match input/output voltage levels and isolate different logic domains. Presence of these additional devices increases power consumption, especially current leakage in the active power saving mode. Therefore, it would be desirable to provide an improved data retention flip flop that is preferably disposed at a circuit boundary location, the improved data retention flip flop also providing output isolation in addition to data retention.

Thus, there is an existing need to provide an improved apparatus for providing data retention having reduced leakage current in an active power mode, the reduced leakage current being achieved while attaining desired performance and desired silicon area, absent the disadvantages found in the prior art techniques discussed above.

The foregoing need is addressed by the teachings of the present disclosure, which relates to an apparatus for data retention during an active power saving mode. According to one embodiment, a level shifting isolation flip flop (LSIFF) apparatus for providing active mode power reduction for circuits having data retention includes a master slave flip flop (MSFF) for latching a data input. An output level shifter (OLS), coupled to the MSFF, retains the data input in response to the MSFF being operable in an active power saving mode (APSM) to reduce power. The OLS operating in the APSM provides a level shifter output having a configurable voltage, thereby providing output isolation. A change in an operating mode of the MSFF between an active mode and the APSM is independent of a retention (RET) mode input.

In one aspect of the disclosure, a clock-controlled retention scheme (CCRS) apparatus for data retention during an active power saving mode includes a first latch for latching a data input and a second latch coupled to the first latch to form an output node. The second latch is operable to retain the data input in an active power savings mode (APSM), during which the first latch is inoperative to reduce power. An inverter that is coupled to the output node provides an inverse of the data input. A clock inverter operable to invert an inverse of a clock signal, the clock signal being configured to hold a configurable voltage level to trigger the APSM.

In another aspect of the disclosure, an apparatus includes a first power domain having a plurality of first integrated circuits and a second power domain having a second plurality of circuits. The plurality of first integrated circuits includes at least one of a level-shifting isolation flip-flop (LSIFF) configured as a boundary device. The LSIFF is operable to retain data in response to the first circuit being operable in an active power saving mode (APSM). Selected ones of the plurality of second integrated circuits are interfaced to the plurality of first integrated circuits by the LSIFF. The LSIFF is operable to provide a configurable voltage level in the APSM, thereby providing output isolation between the first power domain and the second power domain.

Several advantages are achieved by the improved apparatus according to the illustrative embodiments presented herein. The embodiments advantageously provide a clock-free or clock-independent apparatus, e.g., LSIFF, and a clock-controlled apparatus, e.g., CCRS, for data retention when operating in an active power reduction mode. The LSIFF and the CCRS circuits are advantageously free from the use of RET signal, thereby eliminating the associated clock latency, time delay and complexity of the RET handling logic. The embodiments advantageously provide power to selected circuits not associated with data retention by a first power supply having a switchable voltage level and provide power to selected circuits having data retention by a second 'always on' power supply having a fixed voltage level. The selected circuits not associated with data retention are powered by the first power supply having a shifted voltage level to reduce leakage and reduce power in response to a switch from an active mode to an active power saving mode. The shift in the voltage level is dynamic and in real-time, e.g., achieved in a timely manner, responsive to the request to enter the active power saving mode. The LSIFF advantageously provides a dramatic power reduction in the APSM of about 600% to about 1000% when compared to power consumption of a flip flop without data retention used as a benchmark. Similarly, the CCRS advantageously provides a dramatic power reduction in the APSM of about 500% to about 900% when compared to power consumption of the flip flop without data retention used as a benchmark. Both the LSIFF and CCRS advantageously retain an acceptable performance and an acceptable increase in silicon area compared to the performance and silicon area characteristics of a flip flop without data retention used as a benchmark.

DETAILED DESCRIPTION

Figure 1A:
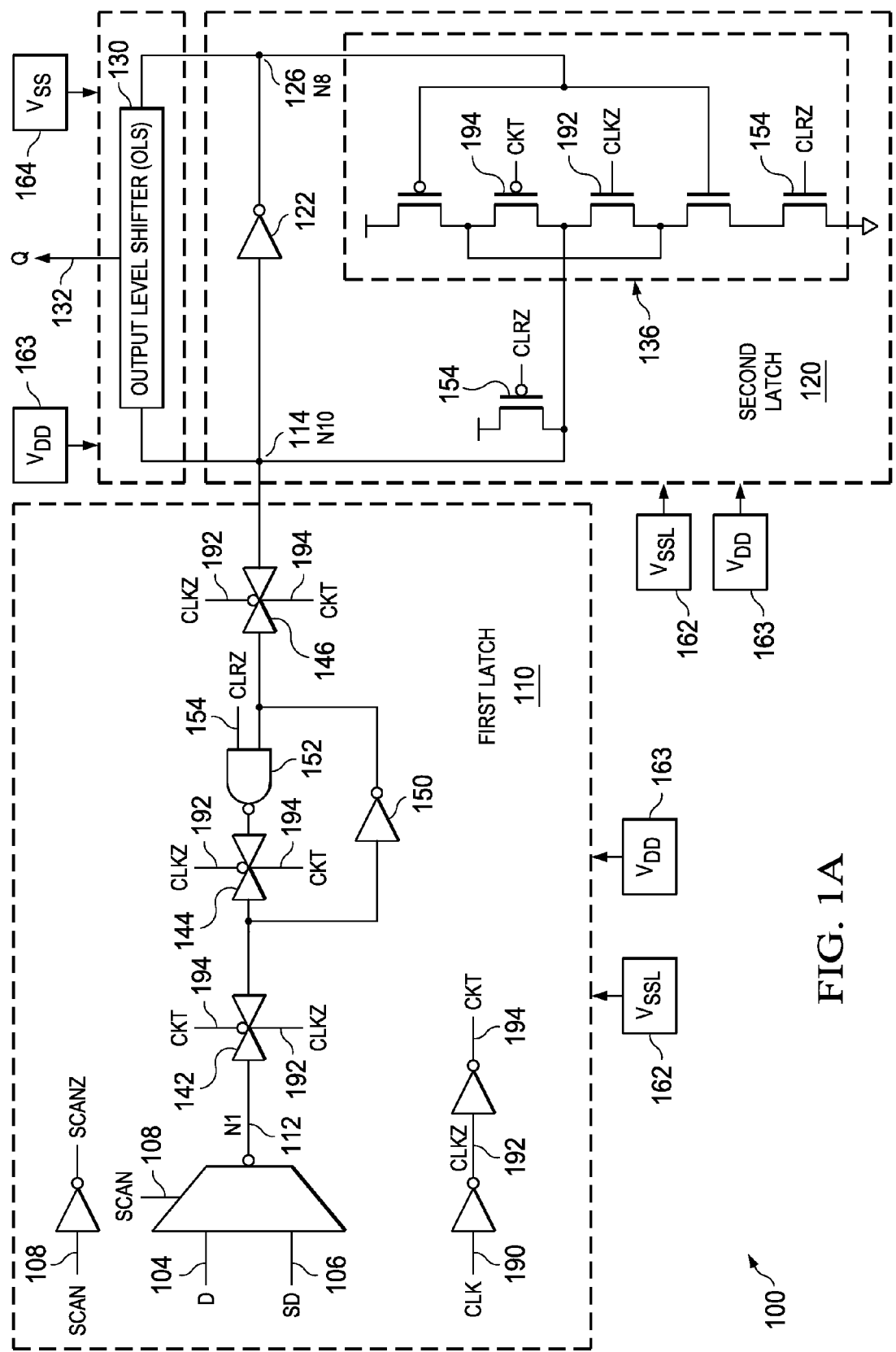
FIG. 1A is a simplified circuit diagram of a clock free type data retention apparatus, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Providing data retention circuits having desirable characteristics for leakage current, performance, and silicon area has been a challenge since many traditional data retention flip flops rely on the use of a retention (RET) signal as a trigger for reducing power in sleep states. For example, a traditional data retention circuit having a RET signal to control power distribution may be optimized for reduced leakage current but may use increased silicon area and may deliver undesirable performance for real-time applications such as active power save mode. These problems, among others, may be addressed by an improved apparatus for data retention that is capable of delivering power savings in real-time applications such as active power saving mode. According to an embodiment, a level shifting isolation flip flop (LSIFF) apparatus for providing active mode power reduction for circuits having data retention includes a master slave flip flop (MSFF) for latching a data input. An output level shifter (OLS), coupled to the MSFF, retains the data input in response to the MSFF being operable in an active power saving mode (APSM) to reduce power. The OLS operating in the APSM provides a level shifter output having a configurable voltage, thereby providing output isolation. A change in an operating mode of the MSFF between an active mode and the APSM is independent of a retention (RET) mode input.

A clock-free data retention apparatus capable of providing reduced power consumption in an active power saving mode is described with reference to FIGS. 1A and 1B. A clock-controlled data retention apparatus capable of providing reduced power consumption in an active power saving mode is described with reference to FIGS. 3A and 3B. A data retention apparatus using a level-shifting isolation flip-flop (LSIFF) configured as a boundary device to provide output isolation between two circuits is described with reference to FIG. 5A. FIGS. 2 and 4 illustrate waveforms and timing associated with the data retention apparatus described with reference to FIGS. 1A, 1B, 3A, and 3B. Benchmarking results of the data retention apparatus described with reference to FIGS. 1A, 1B, 2, 3A, 3B, 4, and 5A with a traditional flip flop without data retention are described with reference to FIG. 6.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more ICs packaged into a module.

Power saving modes of operation—An electronic device is operable in a plurality of operating modes (or states) such as active or normal, power saving, power off, test, off-line, and similar others. While operating in the active or normal operating mode, the device performs desired function(s) and consumes rated power. Any operating mode that provides a reduction in power compared to the active mode is described as a power saving mode of operation. The device may typically include a power management controller (PMC) to control entry and exits into the various operating modes in response to receiving monitoring inputs such as processor activity. The power saving modes may be segmented into various types in dependence of a time period during which the power savings occur. As described earlier, a time duration for which the device (or a portion thereof) may be placed in a power-down or power-off mode may vary from indefinite to several days or hours. The time duration for a standby power mode, which is dependent on the activity level, may vary from several hours or days to several minutes, and the active power saving mode may vary from several minutes to a couple or several clock cycles. An entry and exit to and from the active power saving mode is described as a real-time application since responsiveness of a circuit to enter and exit the active power saving mode in a timely manner is required. Obviously, the specific time duration may vary depending on each application.

Data retention flip flop—A flip flop type that is operable to save, retain, or preserve data during a power saving mode of operation and operates as a traditional flip flop during a non-power saving mode of operation.

Leakage current in a data retention flip flop—A current flowing through the data retention flip flop operating in a power saving mode to retain data.

Clock-controlled data retention flip flop—A data retention flip flop that retains data only when a clock signal is held at a low level at the time the flip flop enters and exits the power saving mode.

Clock free retention flip flop—A data retention flip flop that retains data independent of (or free from) a high or low state of a clock signal at the time the flip flop enters and exits the power saving mode.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, during periods of inactivity a scalable power supply may be configured to operate at a lower (or higher) voltage level to advantageously save power. That is, the voltage level of the power supply may be configured to operate at one of approximately 0.5 volts, 0.6 volts, or 0.7 volts.

Figure 2:
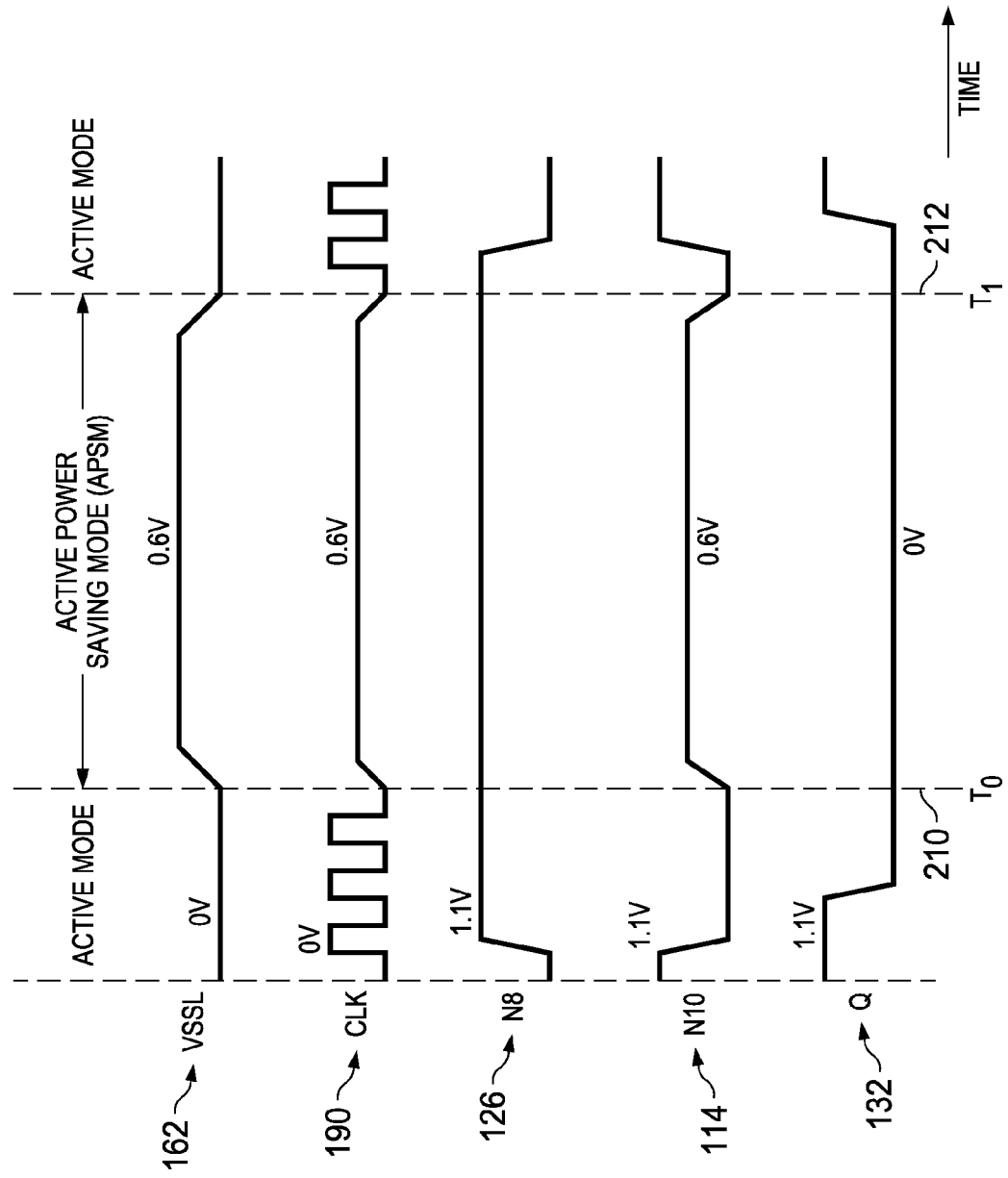
FIG. 2 illustrates waveforms associated with a data retention apparatus described with reference to FIGS. 1A and 1B, according to an embodiment.

FIG. 1A is a simplified circuit diagram of a clock free type data retention apparatus 100, according to an embodiment. In the depicted embodiment, the clock free type data retention apparatus 100 is implemented as a level shifting isolation flip flop (LSIFF) circuit. In an exemplary, non-depicted embodiment, the apparatus 100 is included in an electronic device such as a cellular phone, a digital camera/camcorder, a pocket computer, a laptop computer, a personal entertainment device or any other similar portable, battery operated device. The electronic devices include multiple chips such as microprocessors, digital signal processors, radio frequency circuits, memory, microcontrollers such as input/output controllers, and the like. The electronic device and hence the apparatus 100 is operable in at least two operating modes, e.g., a normal operating mode consuming rated power during periods of normal chip activity and an active power saving mode (APSM) consuming reduced power (relative to the active mode) during periods of detected inactivity or reduced activity. Responsiveness of the apparatus 100 to enter and exit between the active mode and the active power saving mode occurs instantaneously and the apparatus 100 is ready to track input within a few configurable cycles of a clock CLK 190 (also referred to as a clock gating input signal or simply as a clock signal), e.g., preferably within 1-2 clock cycles.

The apparatus 100 (also referred to as LSIFF 100) includes a first latch 110 (also referred to as a master latch) coupled to receive a data input D 104, a second latch 120 (also referred to as a slave latch) coupled to the first latch 110 to form a node N10 114, and an output level shifter (OLS) 130 coupled to the nodes N10 114 and N8 126. The OLS 130 is operable to perform voltage level shifting, provide output isolation, and retain a status of the data input D 104 upon exit from the active mode and entry into the APSM and restore the status of the data input D 104 upon re-entry into the active mode. The OLS 130 provides a level shifter output as output Q 132. Additional details of the OLS 130 are described with reference to FIG. 1B. The apparatus 100 is described as a clock-free data retention flip flop since the OLS 130 retains the data input D 104 independent of (or free from) a high or low logic level of the clock CLK 190 at the time the flip flop enters and exits the active power saving mode.

The first latch 110 is coupled to a multiplexer 102 to receive the data input D 104 or a scan data input SD 106. A scan control input 108 selects one of the data input D 104 or the SD 106 as an input received at node N1 112 of the first latch 110. The first latch 110 provides an output at node N10 114 that is coupled to the second latch 120 as an input. Included in the first latch 110 and disposed in series between the node N1 112 and the node N10 114 are signal gates (also referred to as transmission gates) SG1 142 controlled by CKT 194 and CLKZ 192, SG2 144 controlled by CLKZ 192 and CKT 194, a NAND gate 152, and SG3 146 controlled by CLKZ 192 and CKT 194. Coupled in parallel with a series combination of the NAND gate 152 the SG2 144 is a master inverter 150. CLRZ 154 is an asynchronous reset signal that is received by the NAND gate 152 to reset the output Q 132 to a logic low state.

During the active mode, the apparatus 100 operates as a traditional flip flop. The first latch 110 and the second latch 120 work in combination controlled by the CLK 190, to store and propagate input data D 104 to the output Q 132. Data stored in the first latch 110 is propagated to the output Q 132 when CLK 190 is high (this also writes data in parallel to the second latch 120 when CLK 190 is high). Data stored in the second latch 120 is propagated to the output Q 132 when CLK 190 is low. At this time (when CLK 190 is low) new data is being written to the first latch 110. Unlike a traditional flip flop, the OLS 130 advantageously includes additional circuitry for data retention, the additional circuitry contributing to reduced leakage current, while attaining desired performance and being implementable in a desired silicon area. With this additional circuitry, the OLS 130 is operable to retain a state of the data input D 104 in the APSM and restore the retained state of the data input D 104 as the output Q 132 upon exiting the APSM. Unlike traditional data retention circuits, the apparatus 100 does not advantageously depend on the use of the RET signal (not shown) for the retention of the data input D 104.

Unlike a conventional master-slave flip flop (MSFF), which is typically powered by a single power source and which does not retain data when the desired voltage levels are not supplied to the MSFF, the apparatus 100 is powered by two power sources, a first power source $V_{SSL}$ 162 capable of providing a switchable local ground (e.g., between a first voltage level and a second voltage level) and a second power source $V_{SS}$ 164. In a particular embodiment, a full rail output provided by the $V_{SSL}$ 162 and the $V_{SS}$ 164 sources may include voltage levels of 1.1 volts (used as $V_{DD}$), 0.965 volts, 0.7 volts, 0.6 volts, 0.5 volts, and 0 volts. The second power source $V_{SS}$ 164 provides 'always on' power that is independent of the power saving mode of operation. That is, the second power source $V_{SS}$ 164 is active, e.g., switched on, during all power modes including the APSM and the active power mode.

Any circuits and/or devices powered by the second power source $V_{SS}$ 164 continue to receive power in the APSM as well as the active power mode. Any current flowing through the circuits and/or devices powered by the second power source $V_{SS}$ 164 operating in the APSM is described as a leakage current. The switching off or level shifting of the switchable local ground first power source $V_{SSL}$ 162 to save power has no effect on the input data D 104 retained in the OLS 130. In the depicted embodiment, both the first latch 110 and the second latch 120 are powered by the first power source $V_{SSL}$ 162 that is capable of providing reduced power in the APSM. The OLS 130 is powered by the second power source $V_{SS}$ 164, which is 'always on' and is capable of providing a constant voltage level independent of the operating state.

In a particular embodiment, both the first power source $V_{SSL}$ 162 and the second power source $V_{SS}$ 164 may be derived from a single, system level power source and may have a scalable supply voltage. That is, a voltage level of the $V_{SSL}$ 162 and a voltage level of the $V_{SS}$ 164 may be varied, e.g., scaled up or scaled down, depending on the activity level. Thus, during periods of inactivity or reduced activity the voltage level of $V_{SSL}$ 162 may be advantageously scaled up or down, e.g., from 0 volts in active power mode to a voltage level between 0.5 volts to 0.7 volts in the APSM, to reduce leakage current and hence power consumption.

The second latch 120 includes a second latch inverter 122 having an inverter input received at node N10 114 and providing an inverter output at node N8 126. The second latch 120 also includes an output generating circuit 136 disposed between the node N8 126 and the node N10 114 and in parallel to the inverter 122. The output generating circuit 136 includes five switches coupled in series disposed between $V_{DD}$ 163 and the switchable power source $V_{SSL}$ 162. The output generating circuit 136 is controlled by a state of the node N8 126, which stores a state corresponding to the data input D 104, CKT 194 CLKZ 192 and CLRZ 154 signals. When node N8 126 is at a low state and CKT 194 is low, node N10 114 is at a high state, and output Q 132 is restored to a low state. When node N8 126 is at a high state and CLKZ 192 is high (or CLK 190 is low), node N10 114 is at a low state, and output Q 132 is restored to a high state. Current path from $V_{DD}$ 163 to the switchable power source $V_{SSL}$ 162 is disabled when CLRZ 154 is at a low level. The second latch 120 also includes a circuit to disable CLRZ 154 signal in retention mode. That is, if CLRZ 154 is asserted in the APSM it will have no effect on the state of the data input D 104 retained by the second latch 120.

In an exemplary, non-depicted embodiment, a power management controller (PMC) is included in the apparatus 100 to reduce power consumption in accordance with a monitored activity level. That is, the PMC is operable to control a mode of operation of the apparatus 100 in dependence of the activity by controlling the entry and exit into and from active mode and active power saving mode. The PMC also controls the operation of the first power source $V_{SSL}$ 162 in response to the activity. Additional details of a local level or power domain specific implementation of a PMC as a power switch controller (PSCON) device is described with reference to FIG. 5A and FIG. 5B.

During active mode, the output Q 132 corresponds to the state of the data input D 104. In the APSM, the output Q 132 corresponds to the retained state of the data input D 104. The voltage levels associated with the output Q 132 always correspond to full rail output, e.g., 1.1 volts and 0.0 volts, and are independent of the operating mode. In response to a change in the operating mode from the active power saving mode to the active mode, a voltage level of the first power source $V_{SSL}$ 162 is switched from a first level, e.g., 0.6 volts to a second voltage level, e.g., 0.0 volts. The real-time performance of the apparatus 100 enables the instantaneous restoration of the output Q 132 to the previously retained state of the data input D 104 and enables the output Q 132 to track the data input D 104 within a configurable number of clock cycles of exiting the APSM, e.g., within 1 to 2 clock cycles. Additional details of the apparatus 100 such as timing aspects are described with reference to FIG. 2.

Figures 1B, 6:
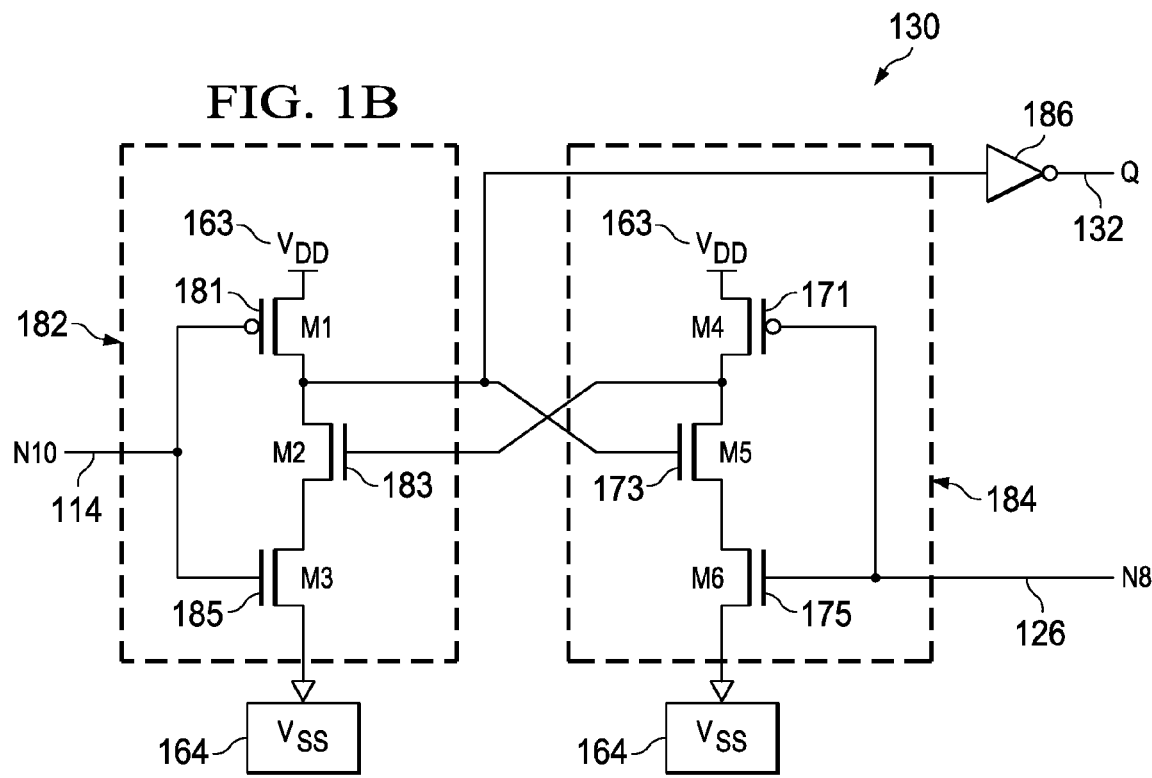
FIG. 1B is a simplified circuit diagram illustrating additional details of an output level shifter described with reference to FIG. 1A, according to an embodiment.
FIG. 6 includes tabular data illustrating silicon area, performance, and leakage current comparison for data retention circuits described with reference to FIGS. 1A, 1B, 2, 3A, 3B, 4, and 5A, according to an embodiment.

FIG. 1B is a simplified circuit diagram illustrating additional details of an output level shifter 130 described with reference to FIG. 1A, according to an embodiment. The OLS 130 includes a plurality of first switches 182, which include switches M1 181, M2 183, and M3 185, coupled in series between the second power source $V_{SS}$ 164 and $V_{DD}$ 163. Switches M1 181 and M3 185 are controlled by the node N10 114 in dependence of the data input D 104. A plurality of second switches 184, which include switches M4 171, M5 173, and M6 175, are coupled in series between the second power source $V_{SS}$ 164 and $V_{DD}$ 163. Switches M4 171 and M6 175 are controlled by the node N8 126 in dependence of an inverse of the data input D 104. The plurality of switches 182 and 184 are cross coupled. That is, switch M2 183 is controlled by an output of the switch M4 171 and switch M5 173 is controlled by the output of the switch M1 181. An inverter 186 is coupled to the output of the switch M1 181 and the gate of the switch M5 175, the inverter 186 being operable to provide the level shifter output Q 132. A voltage level of Q 132 is configurable, e.g., to a full rail output voltage, during data retention, e.g., in APSM, thereby providing the output isolation between the apparatus 100 and an external circuit (not shown). When a logic level of the data input D 104 is low, node N10 114 is low and node N8 126 is high, output Q 132 is low, M1 181, M5 173 and M6 175 are closed, and M2 183, M3 185, and M4 171 are open. When a logic level of the data input D 104 is high, node N10 114 is high and node N8 126 is low, output Q 132 is high, M1 181, M5 173 and M6 175 are open, and M2 183, M3 185, and M4 171 are closed.

FIG. 2 illustrates waveforms associated with an apparatus 100 described with reference to FIGS. 1A and 1B, according to one embodiment. Referring to FIG. 2, at time $t=t_0$ 210, the CLK 190 is gated low (by a device or circuit that is included in the electronic device but excluded from the apparatus 100) and is indicative of a transition or switch from an active power mode to an active power saving mode. Prior to entering the APSM, the output Q 132 is held to a low level, which is the state of the data input D 104. Node N10 114 is low and N8 126 is high. The first source $V_{SSL}$ 162 outputs a first voltage level equal to 0.0 volts. Upon entry into the APSM, the output Q 132 continues to be held to the low level, which is the retained state of the data input D 104. The first power source $V_{SSL}$ 162 outputs a second voltage level, e.g., 0.6 volts to reduce leakage current. Node N10 114 is raised to the higher local ground level, e.g., 0.6 volts and N8 126 remains at the high level. The CLK 190 signal is also raised to the higher local ground level, e.g., 0.6 volts, to reduce leakage current.

At t=t$_1$ 212 a transition is initiated (by the device or circuit that is included in the electronic device but excluded from the apparatus 100) from the active power saving mode to the active mode. Prior to entering the active mode, the output Q 132 is held to the low level, which is the state of the retained data input D 104. The first source V$_{SSL}$ 162 switches voltage levels from the second voltage level of 0.6 volts to the first voltage level equal to 0.0 volts. Node N10 114 returns to 0.0 volts from the higher local ground level, e.g., 0.6 volts and N8 126 is maintained at the high level. The CLK 190 is operational. Upon entry into the active mode, the output Q 132 is instantaneously restored to the previously retained state of the data input D 104 and is thereby enabled to track the data input D 104 within a configurable number of clock cycles of exiting the APSM, e.g., within 1 to 2 clock cycles. For example, a transition of the data input D 104 is detected in the first clock cycle after t$_1$ 212 at node N10 114 and the output Q 132 changes from low to high within 1 clock cycle of the detected change in the data input D 104.

Figure 3A:
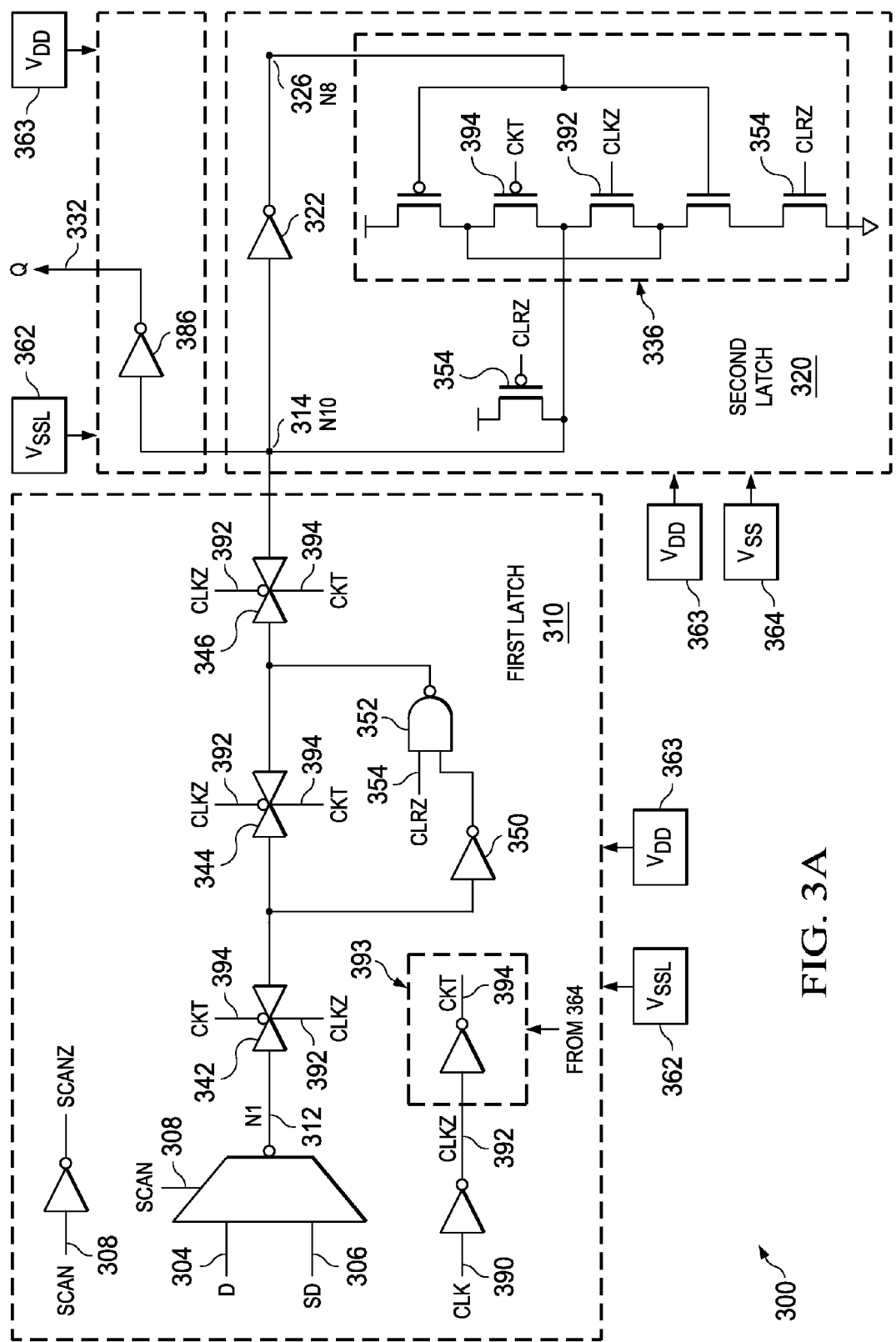
FIG. 3A is a simplified circuit diagram of a clock controlled type internal data retention apparatus, according to an embodiment.
Figure 3B:
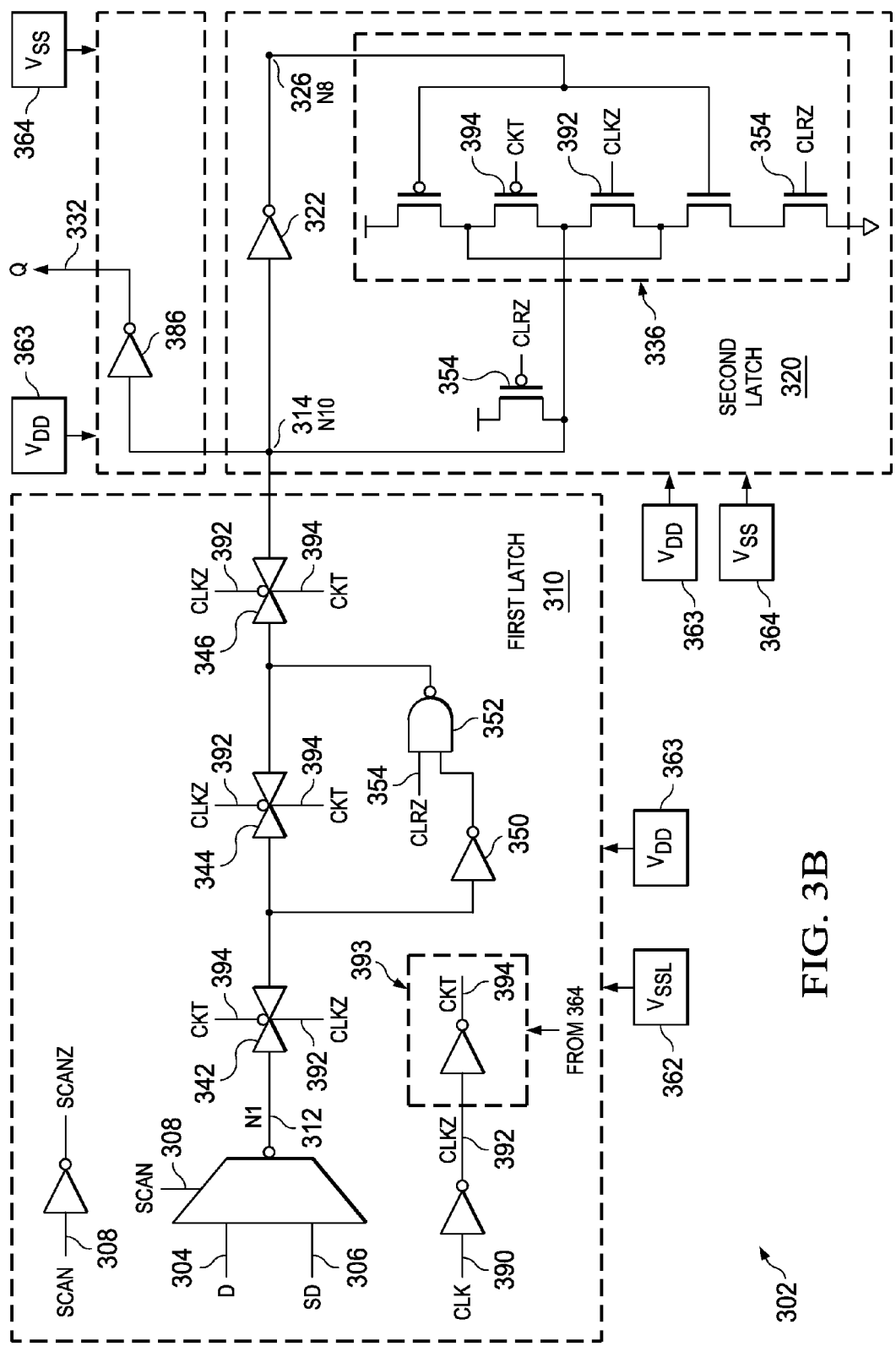
FIG. 3B is a simplified circuit diagram of a clock controlled type boundary data retention apparatus, according to an embodiment.
Figure 4:
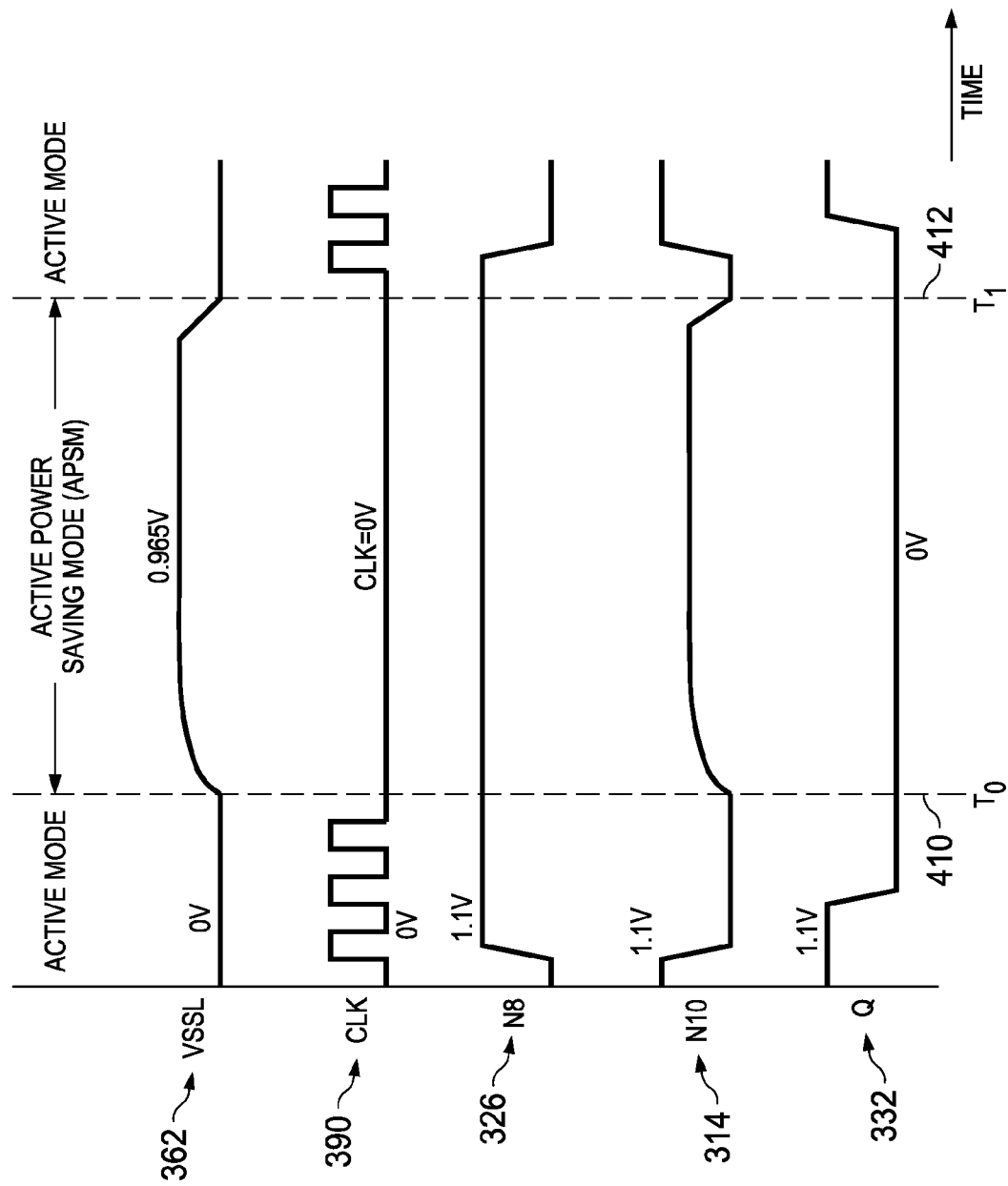
FIG. 4 illustrates waveforms associated with a clock controlled type internal data retention apparatus and a clock controlled type boundary data retention apparatus described with reference to FIGS. 3A and 3B, according to an embodiment.

FIG. 3A is a simplified circuit diagram of a clock controlled type internal data retention apparatus 300, according to an embodiment. The clock controlled type internal data retention apparatus 300 is implemented as a clock controlled retention scheme (CCRS) circuit for use in an internal data retention latch application. An internal data retention latch may be used to couple to other devices located in the same logic domain or circuit board. FIG. 3B is a simplified circuit diagram of a clock controlled type boundary data retention apparatus 302, according to an embodiment. The clock controlled type boundary data retention apparatus 302 is implemented as another clock controlled retention scheme (CCRS) circuit for use in a boundary data retention latch application. A boundary data retention latch may be used to interface to other external devices located in a different logic domain or located on a different circuit board.

Referring to FIGS. 3A and 3B, the apparatus 300 and apparatus 302 have an identical circuit configuration except for the powering schemes deployed during the APSM. In addition, the apparatus 300 and the apparatus 302 are substantially similar to the apparatus 100 described with reference to FIG. 1A except for the output level shifter OLS 130. The apparatus 300 and the apparatus 302 each include an inverter 386 (same as the OLS 130 but without the plurality of first switches 182 and without the plurality of second switches 184). The apparatus 300 and the apparatus 302 may be described to be of the clock dependent type since data retention occurs by maintaining CLK 390 at a logic low level (by a device or circuit that is included in an electronic device but excluded from the apparatus 300 and the apparatus 302) during operation in the APSM. Similar to the apparatus 100, the apparatus 300 and the apparatus 302 do not advantageously depend on the use of the RET signal (not shown) for the retention of the data input D 304.

In an exemplary, non-depicted embodiment, the apparatus 300 and apparatus 302 are included in an electronic device such as a cellular phone, a digital camera/camcorder, a pocket computer, a laptop computer, a personal entertainment device or any other similar portable, battery operated device. The electronic devices include multiple chips such as microprocessors, digital signal processors, radio frequency circuits, memory, microcontrollers such as input/output controllers, and the like. The electronic device and hence the apparatus 100 is operable in at least two operating modes, e.g., a normal operating mode consuming rated power during periods of normal chip activity and an active power saving mode (APSM) consuming reduced power (relative to the active mode) during periods of detected inactivity or reduced activity. Responsiveness of the apparatus 300 and the apparatus 302 to enter and exit between the active mode and the active power saving mode occurs instantly and the output Q 332 is able to track the data input D 304 within a few configurable cycles of a clock CLK 390, e.g., preferably within 1-2 clock cycles.

The apparatus 300 and the apparatus 302 (also referred to as CCRS) includes a first latch 310 (also referred to as a master latch) coupled to receive a data input D 304, a second latch 320 (also referred to as a slave latch) coupled to the first latch 310 to form a node N10 314, and the inverter 386 is coupled to the node N10 314. The inverter 386 provides an output Q 332 in accordance with the data input D 304.

The first latch 310 is coupled to a multiplexer 302 to receive the data input D 304 or a scan data input SD 306. A scan control input 308 selects one of the data input D 304 or the SD 306 as an input received at node N1 312 of the first latch 310. The first latch 310 provides an output at node N10 314 that is coupled to the second latch 320 as an input. Included in the first latch 310 and disposed in series between the node N1 312 and the node N10 314 are signal gates (also referred to as transmission gates) SG1 342 controlled by CKT 394 and CLKZ 392, SG2 344 controlled by CLKZ 392 and CKT 394, and SG3 346 controlled by CLKZ 392 and CKT 394. Coupled in parallel with the SG2 344 is a series combination of a master inverter 350 and the NAND gate 352. CLRZ 354 is an asynchronous reset signal that is received by the NAND gate 352 to reset the output Q 332 to a logic low state.

During the active mode, the apparatus 300 and the apparatus 302 operate as a traditional flip flop. The first latch 310 and the second latch 320 work in combination controlled by the CLK 390, to store and propagate input data D 304 to the output Q 332. Data stored in the first latch 310 is propagated to the output Q 332 when CLK 390 is high (this also writes data in parallel to the second latch 320 when CLK 390 is high). Data stored in the second latch 320 is propagated to the output Q 332 when CLK 390 is low. At this time (when CLK 390 is low) new data is being written to the first latch 310.

Unlike a traditional flip flop, the inverter 386 of the apparatus 302 is advantageously powered to maintain the output Q 332 at a known voltage level in the APSM (when CLK 390 is held to a low level). A known voltage level is desired to provide output isolation between the inverter 386 and an external circuit (not shown). Since the apparatus 300 is used as an internal data retention flip flop a status of the data input D 304 may be held even under reduced retention voltage levels while enabling power savings. Unlike traditional data retention circuits, but similar to the apparatus 100, the apparatus 300 and the apparatus 302 do not advantageously depend on the use of the RET signal (not shown) for the retention of the data input D 304.

Unlike a conventional master-slave flip flop (MSFF), which is typically powered by a single power source and which does not retain data when the desired voltage levels are not supplied to the MSFF, the apparatus 300 and the apparatus 302 is powered by two power sources, a first power source V$_{SSL}$ 362 capable of providing a switchable local ground (e.g., between a first voltage level and a second voltage level) and a second power source V$_{SS}$ 364. In a particular embodiment, a full rail output provided by the V$_{SSL}$ 362 and the V$_{SS}$ 364 sources may include voltage levels of 1.1 volts (used as V$_{DD}$), 0.965 volts, and 0 volts. The second power source V$_{SS}$ 364 provides 'always on' power that is independent of the power saving mode of operation. That is, the second power source $V_{SS}$ 364 is active, e.g., switched on, during all power modes including the APSM and the active power mode.

Any circuits and/or devices powered by the second power source $V_{SS}$ 364 continue to receive power in the APSM as well as the active power mode. Any current flowing through the circuits and/or devices powered by the second power source $V_{SS}$ 364 operating in the APSM is described as a leakage current. The switching off or level shifting of the switchable local ground first power source $V_{SSL}$ 362 to save power has no effect on the input data D 304 retained in the slave latch 320.

Referring to FIG. 3A, both the first latch 310 and the inverter 386 of the apparatus 300 are powered by the first power source $V_{SSL}$ 362 that is capable of providing reduced power in the APSM. The second latch 320 and an inverter 393 (operable to invert CLKZ 382 to CKT 394) is powered by the second power source $V_{SS}$ 364, which is 'always on' and is capable of providing a constant voltage level independent of the operating state.

Referring to FIG. 3B, the first latch 310 of the apparatus 302 is powered by the first power source $V_{SSL}$ 362 that is capable of providing reduced power in the APSM. The second latch 320, the inverter 386, and the inverter 393 are powered by the second power source $V_{SS}$ 364, which is 'always on' and is capable of providing a constant voltage level independent of the operating state. In an exemplary, non-depicted embodiment, clock tree synthesis cells, integrated clock gating cells or similar other cells for generating, distributing or processing the CKT 190 signal are also powered by the second power source $V_{SS}$ 364, which is 'always on'.

Referring to FIGS. 3A and 3B, in a particular embodiment, both the first power source $V_{SSL}$ 362 and the second power source $V_{SS}$ 364 may be derived from a single, system level power source and may have a scalable supply voltage. That is, a voltage level of the $V_{SSL}$ 362 and a voltage level of the $V_{SS}$ 364 may be varied, e.g., scaled up or scaled down, depending on the activity level. Thus, during periods of inactivity or reduced activity the voltage level of $V_{SSL}$ 362 may be advantageously scaled up or down, e.g., from 0 volts in active power mode to a voltage level of 0.965 volts in the APSM, to reduce leakage current and hence power consumption.

The second latch 320 includes a second latch inverter 322 having an inverter input received at node N10 314 and providing an inverter output at node N8 326. The second latch 320 also includes an output generating circuit 336 disposed between the node N8 326 and the node N10 314 and in parallel to the inverter 322. The output generating circuit 336 includes five switches coupled in series disposed between $V_{DD}$ 363 and the switchable power source $V_{SSL}$ 362. The output generating circuit 336 is controlled by a state of the node N8 326, which stores a state corresponding to the data input D 304, CKT 394 CLKZ 392 and CLRZ 354 signals. When node N8 326 is at a low state and CKT 394 is low, node N10 314 is at a high state, and output Q 332 is restored to a low state. When node N8 326 is at a high state and CLKZ 392 is high (or CLK 390 is low), node N10 314 is at a low state, and output Q 332 is restored to a high state. Current path from $V_{DD}$ 363 to the switchable power source $V_{SSL}$ 362 is disabled when CLRZ 354 is at a low level. The second latch 320 also includes a circuit to disable CLRZ 354 signal in retention mode. That is, if CLRZ 354 is asserted in the APSM it will have no effect on the state of the data input D 304 retained by the second latch 320.

In an exemplary, non-depicted embodiment, a power management controller (PMC) is included in the apparatus 300 and the apparatus 302 to reduce power consumption in accordance with a monitored activity level. That is, the PMC is operable to control a mode of operation of the apparatus 300 and the apparatus 302 in dependence of the activity by controlling the entry and exit into and from active mode and active power saving mode. The PMC also controls the operation of the first power source $V_{SSL}$ 362 in response to the activity. As described earlier, additional details of a local level or power domain specific implementation of a PMC as a power switch controller (PSCON) device is described with reference to FIG. 5A and FIG. 5B.

During active mode, the output Q 332 corresponds to the state of the data input D 304. In the APSM, the CLK 190 is maintained at a low logic level and the output Q 332 corresponds to the retained state of the data input D 304. The voltage levels associated with the output Q 132 always correspond to full rail output, e.g., 1.1 volts and 0.0 volts, and these voltage levels are independent of the operating mode. Leakage current reduction is achieved in APSM by powering a plurality of internal devices, e.g., approximately 72% of the devices, included in the apparatus 300 and the apparatus 302 by the first power source $V_{SSL}$ 362. In response to a change in the operating mode from the active power saving mode to the active mode, a voltage level of the first power source $V_{SSL}$ 362 is switched from a first level, e.g., 0.965 volts to a second voltage level, e.g., 0.0 volts. The real-time performance of the apparatus 300 and the apparatus 302 enables the instantaneous restoration of the output Q 332 to the previously retained state of the data input D 104 and enables the output Q 332 to track the data input D 304 within a configurable number of clock cycles of exiting the APSM, e.g., within 1 to 2 clock cycles. Additional details of the apparatus 300 and the apparatus 302 such as timing aspects are described with reference to FIG. 4.

FIG. 4 illustrates waveforms associated with an apparatus 300 and an apparatus 302 described with reference to FIGS. 3A and 3B, according to one embodiment. Referring to FIG. 4, at time $t=t_0$ 410, the CLK 390 is gated to a low level (by a device or circuit that is included in the electronic device but excluded from the apparatus 300 and the apparatus 302) and is indicative of a transition or switch from an active power mode to an active power saving mode. Prior to entering the APSM, the output Q 332 is held to a low level, which is the state of the data input D 304. Node N10 314 is low and N8 326 is high. The first source $V_{SSL}$ 362 outputs a first voltage level equal to 0.0 volts. Upon entry into the APSM, the output Q 332 continues to be held to the low level, which is the retained state of the data input D 304. The first source $V_{SSL}$ 362 is ramped from 0.0 volts to a second voltage level, e.g., 0.965 volts. Node N10 314 is ramped raised to the higher local ground level, e.g., 0.965 volts and N8 326 remains at the high level. The CLK 190 signal is maintained at the low logic level.

At $t=t_1$ 412 a transition is initiated (by the device or circuit that is included in the electronic device but excluded from the apparatus 300 and the apparatus 302) from the active power saving mode to the active mode. Prior to entering the active mode, the output Q 332 is held to the low level, which is the state of the retained data input D 304. The first source $V_{SSL}$ 362 switches voltage levels from the second voltage level of 0.965 volts to the first voltage level equal to 0.0 volts. Node N10 314 returns to 0.0 volts from the higher local ground level, e.g., 0.965 volts and N8 326 is maintained at the high level. The CLK 390 is operational. Upon entry into the active mode, the output Q 332 is instantaneously restored to the previously retained state of the data input D 304 and is thereby enabled to track the data input D 304 within a configurable number of clock cycles of exiting the APSM, e.g., within 1 to 2 clock cycles. For example, a transition of the data input D 304 is detected in the first clock cycle after $t_1$ 412 at node N10 314 and the output Q 332 changes from low to high within 1 clock cycle of the detected change in the data input D 304.

Figure 5A:
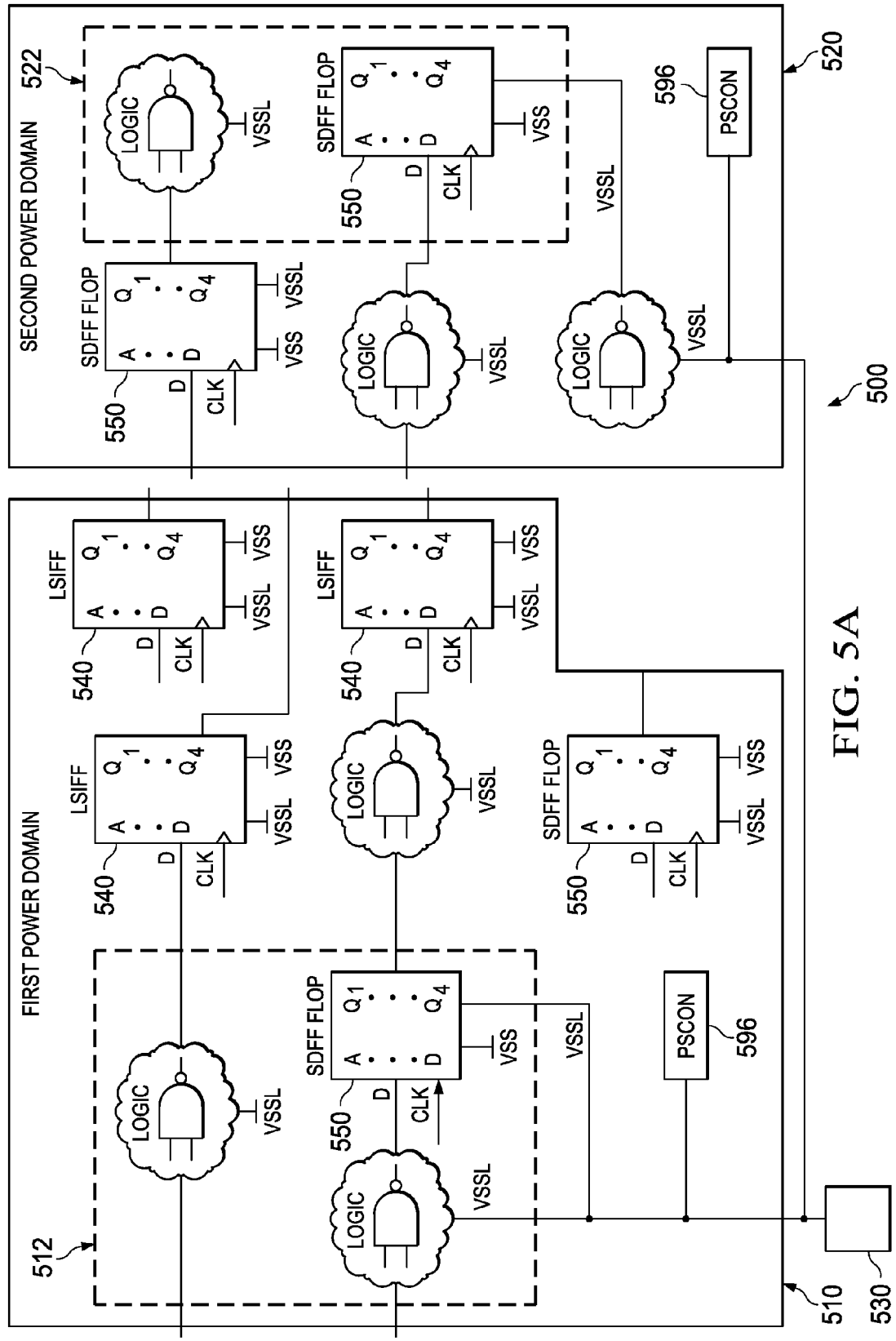
FIG. 5A is a schematic diagram of an apparatus having a level shifting isolation flip flop (LSIFF) used as an isolator for coupling two power domains sharing a common reference voltage, according to an embodiment.
Figure 5B:
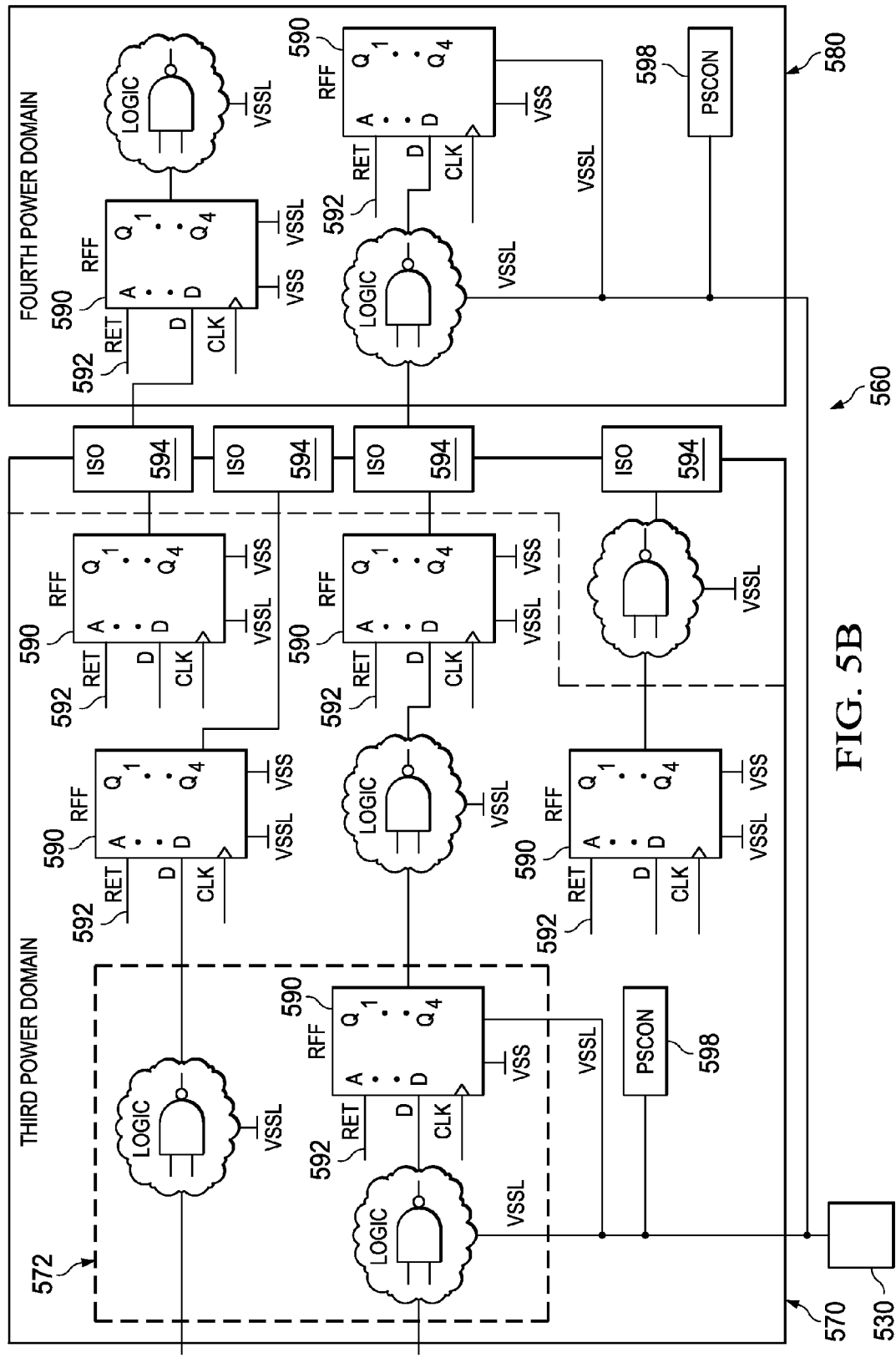
FIG. 5B is a schematic diagram of an apparatus having data retention flip flops and isolators used for coupling two power domains sharing a common reference voltage.

FIG. 5A is a schematic diagram of an apparatus 500 having a level shifting isolation flip flop (LSIFF) used as an isolator for coupling two power domains sharing a common reference voltage, according to an embodiment. FIG. 5B is a schematic diagram of an apparatus having data retention flip flops and isolators used for coupling two power domains sharing a common reference voltage. Referring to FIG. 5A, the apparatus 500 includes a first power domain 510 and a second power domain 520 sharing a common reference voltage 530. The first power domain 510 provides power to a plurality of first integrated circuits 512. The plurality of first integrated circuits 512 includes at least one of a level shifting isolation flip flop (LSIFF) 540 configured as a boundary device. In a particular embodiment, the LSIFF 540 is the same as the apparatus 100 described with reference to FIG. 1. The plurality of first integrated circuits 512 may also include a standard (non-retention) flip flop 550 configured as an internal device. In a particular embodiment, the flip flop 550 does not provide level shifting and output isolation function as the LSIFF 540. Similar to the apparatus 100, the apparatus 300, and the apparatus 302, the apparatus 500 does not advantageously depend on the use of the RET signal (not shown) for the retention of the data.

As described herein, a boundary device is a device that is disposed at a boundary location of the power domain and is the last device included in a chain of devices powered by the power domain. Boundary devices present in each domain may be used to interface one power domain with another. The LSIFF 540 advantageously provides voltage level shifting and output isolation between the first power domain 510 and the second power domain 520. The LSIFF 540 is operable to retain data in response to the first power domain 510 being operable in an active power saving mode (APSM). The common voltage reference 530 is switchable between a first voltage level, e.g., 0.0 volts, and a second voltage level, e.g., 0.6 volts in response to a transition from the active mode to the active power saving mode.

The second power domain 520 includes a plurality of second integrated circuits 522. Selected ones of the plurality of second integrated circuits 522 are interfaced to the plurality of first integrated circuits 512 by the LSIFF 540. The LSIFF 540 is operable to provide a configurable voltage level, e.g., 1.1 volts for high level or 0.0 volts for low level, in the APSM, thereby providing output isolation between the first power domain 510 and the second power domain 520. Each one of the first power domain 510 and the second power domain 520 includes a power switch controller (PSCON) device 596. Working independently and in combination with a power management controller (PMC) (not shown) the PSCON 596 is operable to reduce power consumption in accordance with a monitored activity level. That is, the PSCON 596 is operable to control a mode of operation of the first power domain 510 and the second power domain 520 in dependence of the activity by controlling the entry and exit into and from active mode and active power saving mode.

Referring to FIG. 5B, the apparatus 560 includes a third power domain 570 and a fourth power domain 580 sharing the common reference voltage 530. The third power domain 570 provides power to a plurality of third integrated circuits 572. The plurality of third integrated circuits 572 includes at least one data retention flip flop (RFF) 590 configured as a boundary device. The plurality of third integrated circuits 572 may also include the RFF 590 configured as an internal device.

The RFF 590 is operable to retain data in response to the third power domain 570 being operable in an active power saving mode (APSM). In a particular embodiment, the RFF 590 provides data retention by using a RET 592 signal as an input but does not provide level shifting and output isolation function as the LSIFF 540. The RET 592 signal is used to control the entry and exit between the active mode and the APSM. The common voltage reference 530 is switchable between a first voltage level, e.g., 0.0 volts, and a second voltage level, e.g., 0.6 volts in response to a transition from the active mode to the active power saving mode.

The fourth power domain 580 includes a plurality of fourth integrated circuits 582. Selected ones of the plurality of fourth integrated circuits 582 are interfaced to the plurality of first integrated circuits 512 by an ISO 594. The output isolator ISO 594 provides isolation between the third power domain 570 and the fourth power domain 580. Each one of the third power domain 570 and the fourth power domain 580 includes a power switch controller (PSCON) device 598. Working independently and in combination with a power management controller (PMC) (not shown), the PSCON 598 is operable to reduce power consumption in accordance with parameters such as a state of the RET 592 signal and the activity level.

Referring to FIGS. 5A and 5B, the apparatus 500 is more area efficient and consumes less power compared to the apparatus 560. As described earlier, the apparatus 500 does not depend on the use of the RET 592 signal for entry and exit into the APSM and for the retention of the data, thereby advantageously reducing the silicon area associated with the implementation of the complex chains of the RET 592 signal. In addition, by eliminating the use of the RET 592 signal, the real-time performance of the apparatus 500 is also improved compared to the apparatus 560. Leakage current in the apparatus 500 is advantageously reduced compared to that of the apparatus 560 since only the LSIFF 540 devices are powered during the APSM compared to all the RFF 590 devices in the apparatus 560.

FIG. 6 includes tabular data illustrating silicon area, performance, and leakage current comparison for data retention circuits described with reference to FIGS. 1A, 1B, 2, 3A, 3B, 4, and 5A, according to an embodiment. The traditional master slave flip flop without data retention is used as a benchmark for the comparison. Referring to FIG. 6, table 610 includes performance impact 612, leakage current reduction 614, and silicon area penalty 616 for the data retention circuits (LSIFF and CCRS types) described with reference to FIGS. 1A, 1B, 2, 3A, 3B, 4, and 5A.

Table 610 illustrates computed or simulated results for benchmark criteria such as performance impact 612, leakage current reduction 614, and silicon area penalty 616 associated with the clock controlled type and clock free type data retention circuits using tools such as models and simulation programs. The results indicate that the overall performance of the apparatus 100 (column 620) provides significant and dramatic savings in power consumption, e.g., by approximately 600% to approximately 1000%, compared to traditional flip flop without data retention. In addition, the apparatus 100 provides comparable (within desired limits, e.g., within 1-10%) results in the areas of performance (e.g., measurable in time delay) and the silicon area of the traditional flip flop without data retention.

Similarly, the overall performance results for the apparatus 300 and the apparatus 302 (column 630) when compared to traditional flip flop without data retention indicate significant and dramatic savings in power consumption, e.g., by approximately 500% to approximately 900%. In addition, the apparatus 300 and the apparatus 302 provide comparable (within desired limits, e.g., within 1-3%) results in the areas of performance (e.g., measurable in time delay) and the silicon area of the traditional flip flop without data retention.

Several advantages are achieved by the method and system according to the illustrative embodiments presented herein. The embodiments advantageously provide a clock-free or clock-independent apparatus, e.g., LSIFF, and a clock-controlled apparatus, e.g., CCRS, for data retention when operating in an active power reduction mode. The LSIFF and the CCRS are advantageously free from the use of RET signal, thereby eliminating the associated delay and complexity of the RET handling logic. The embodiments advantageously provide power to selected circuits not associated with data retention by a first power supply having a switchable voltage level and provide power to selected circuits having data retention by a second 'always on' power supply having a fixed voltage level. The selected circuits not associated with data retention are powered by the first power supply having a shifted voltage level to reduce leakage and reduce power in response to a switch from an active mode to an active power saving mode. The shift in the voltage level is dynamic and in real-time, e.g., achieved in a timely manner, responsive to the request to enter the active power saving mode. The LSIFF advantageously provides a dramatic power reduction of about 600% to about 1000% when compared to power consumption of a flip flop without data retention used as a benchmark. Similarly, the CCRS advantageously provides a dramatic power reduction of about 500% to about 900% when compared to power consumption of the flip flop without data retention used as a benchmark. Both the LSIFF and CCRS advantageously retain an acceptable performance and an acceptable increase in silicon area compared to the performance and silicon area characteristics of a flip flop without data retention used as a benchmark.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a flip flop with an asynchronous reset, the methods and circuits described herein may be applied to other types of flip flops with or without resets.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An apparatus comprising:
a master slave flip flop (MSFF) for latching a data input; and
an output level shifter (OLS) coupled to the MSFF, the OLS retaining the data input in response to the MSFF being operable in an active power saving mode (APSM), the OLS providing a level shifter output, the level shifter output having a configurable voltage level in the APSM.

2. The apparatus of claim 1, wherein the MSFF is powered by a first power source and the OLS is powered by a second power source, the first power source providing a first output in dependence of an operating mode of the MSFF, the second power source providing a second output that is independent of an operating mode of the MSFF.

3. The apparatus of claim 2, wherein the first output is configurable to provide a first voltage level corresponding to the MSFF operating in an active mode, wherein the first output is configurable to provide a second voltage level corresponding to the MSFF operating in the APSM, the second voltage level being different than the first voltage level, the APSM providing a reduction in power compared to the active mode.

4. The apparatus of claim 3, wherein the reduction in the power is in a range of approximately 600 percent to approximately 1000 percent compared to a flip flop without the output level shifter.

5. The apparatus of claim 3, wherein a switching between the first voltage level provided during the active mode and the second voltage level provided to the APSM is controlled by a clock signal, the switching being independent of a retention (RET) mode input, the switching being independent of a logic level of the clock signal.

6. The apparatus of claim 5, wherein the level shifter output is switched in response to a change in operating mode from the APSM to the active mode, the level shifter output being switched from the configurable voltage level to match a voltage level of the data input within one clock cycle of the clock signal.

7. The apparatus of claim 1, wherein the OLS includes:
a plurality of first switches coupled in series between a second power source and a voltage reference, the plurality of first switches being coupled to the MSFF to receive the data input;
a plurality of second switches coupled in series between the second power source and the voltage reference, the plurality of second switches being coupled to the plurality of first switches and to the MSFF to receive an inverse of the data input; and
an inverter coupled to the plurality of first switches and coupled to the plurality of second switches, the inverter being operable to provide the level shifter output.

8. The apparatus of claim 7, wherein the plurality of first switches includes:
a first switch coupled to the second power source, the first switch being controlled by the data input;
a second switch coupled to the first switch, the second switch being controlled by an output of the plurality of second switches; and
a third switch coupled to the second switch and the voltage reference, the third switch being controlled by the data input.

9. The apparatus of claim 7, wherein the plurality of second switches includes:
a fourth switch coupled to the second power source, the first switch being controlled by the inverse of the data input;

a fifth switch coupled to the fourth switch, the fifth switch being controlled by an output of the plurality of first switches; and a sixth switch coupled to the fifth switch and the voltage reference, the sixth switch being controlled by the inverse of the data input.

10. The apparatus of claim 1, wherein the level shifter output is equal to the data input in response to the MSFF operating in an active mode.

11. The apparatus of claim 1, wherein a change in an operating mode of the MSFF between an active mode and the APSM is independent of a retention (RET) mode input.

12. The apparatus of claim 1, wherein the configurable voltage level is equal to a desired voltage level of an external circuit coupled to the OLS, thereby providing output isolation there between.

13. An apparatus comprising:

a first power domain providing power to a plurality of first integrated circuits grouped as a first logical block, wherein the plurality of first integrated circuits includes at least one of a level shifting isolation flip flop (LSIFF) configured as a boundary device, wherein the LSIFF is operable to retain data in response to the first circuit being operable in an active power saving mode (APSM); and a second power domain providing power to a plurality of second integrated circuits grouped as a second logical block, wherein selected ones of the plurality of second integrated circuits are interfaced to the plurality of first integrated circuits by the LSIFF, wherein the LSIFF is operable to provide a configurable voltage level in the APSM, thereby providing output isolation between the first power domain and the second power domain.

14. The apparatus of claim 13, wherein the first power domain and the second power domain share a common voltage reference, the common voltage reference being switchable in response to the APSM.

15. The apparatus of claim 13, wherein the LSIFF includes:

a master slave flip flop (MSFF) for latching a data input; and an output level shifter (OLS) coupled to the MSFF, the OLS retaining the data input in response to the MSFF being operable in an active power saving mode (APSM), the OLS providing a level shifter output, the level shifter output having the configurable voltage level in the APSM.

16. An apparatus comprising:

a first latch for latching a data input;

a second latch coupled to the first latch to form an output node, the second latch being operable to retain the data input in an active power savings mode (APSM), the first latch being inoperative in the APSM;

an inverter coupled to the output node, the inverter being operable to provide an inverse of the data input; and a clock inverter operable to invert an inverse of a clock signal, the clock signal being configured to hold a configurable voltage level to trigger the APSM.

17. The apparatus of claim 15 wherein each one of the first latch and the inverter is powered by a first power source and each one of the second latch and the clock inverter is powered by a second power source, the first power source providing a first output in dependence of the clock signal, the second power source providing a second output that is independent of the clock signal.

18. The apparatus of claim 17, wherein the first output is configurable to provide a first voltage level corresponding to the clock signal being generated in an active mode, wherein the first output is configurable to provide a second voltage level corresponding to the clock signal generating the configurable voltage level in the APSM, the second voltage level being different than the first voltage level, the APSM providing a reduction in power compared to the active mode.

19. The apparatus of claim 17, wherein a switching between the first voltage level and the second voltage level is independent of a retention (RET) mode input.

20. The apparatus of claim 17, wherein power provided to the inverter is configurable to be switched from the first power source to the second power to provide output isolation between the inverter and an external circuit.

21. The method of claim 16, wherein the reduction in the power is in a range of approximately 500 percent to approximately 900 percent compared to a flip flop without retention of the data input.

* * * * *